United States Patent [19]

Nakayama et al.

[11] Patent Number: 5,125,360

[45] Date of Patent: Jun. 30, 1992

[54] VACUUM PROCESSING APPARATUS

[75] Inventors: Izumi Nakayama, Hiratsuka; Akitoshi Suzuki; Hiroyuki Nawa, both of Chigasaki; Motohiro Kaneko, Fujisawa, all of Japan

[73] Assignee: Nihon Shinku Gijutsu Kabushiki Kaisha, Kanagawa, Japan

[21] Appl. No.: 299,935

[22] Filed: Jan. 23, 1989

Related U.S. Application Data

[62] Division of Ser. No. 113,117, Oct. 27, 1987, Pat. No. 4,902,531.

[30] Foreign Application Priority Data

| Oct. 30, 1986 | [JP] | Japan | 61-259458 |
| Oct. 31, 1986 | [JP] | Japan | 61-261190 |
| Nov. 1, 1986 | [JP] | Japan | 61-261697 |
| Nov. 4, 1986 | [JP] | Japan | 61-263583 |
| Nov. 5, 1986 | [JP] | Japan | 61-264663 |

[51] Int. Cl.⁵ .............................................. C23C 16/00
[52] U.S. Cl. ................................. 118/730; 118/50.1; 118/620
[58] Field of Search ............... 156/345; 118/50, 50.1, 118/52, 54, 620, 621, 625, 715, 724, 725, 730; 427/39

[56] References Cited

U.S. PATENT DOCUMENTS

| 3,389,070 | 6/1968 | Berghaus et al. | 118/52 |
| 4,208,159 | 6/1980 | Uehara et al. | 118/50 |
| 4,313,783 | 2/1982 | Davies et al. | 156/345 |
| 4,315,705 | 2/1982 | Flint | 118/54 |
| 4,350,562 | 9/1982 | Bonii | 156/345 |
| 4,386,578 | 6/1983 | Haslund | 118/50.1 |
| 4,394,400 | 7/1983 | Green et al. | 118/50.1 |
| 4,399,016 | 8/1983 | Tsukada et al. | 156/345 |
| 4,407,894 | 10/1983 | Kadokura et al. | 204/192.3 |
| 4,446,168 | 5/1984 | Kato et al. | 427/39 |
| 4,465,416 | 8/1984 | Burghalter et al. | 118/50 |
| 4,487,678 | 12/1984 | Noguchi et al. | 204/298 |
| 4,524,089 | 6/1985 | Haque et al. | 427/38 |
| 4,591,821 | 5/1986 | Paulson et al. | 118/715 |
| 4,824,545 | 4/1989 | Ohmi | 204/192.3 |

FOREIGN PATENT DOCUMENTS 57-23227  2/1982  Japan.

Primary Examiner—Willard E. Hoag
Attorney, Agent, or Firm—Larson and Taylor

[57] ABSTRACT

A vacuum processing apparatus in which a DC bias to be produced on the surfaces of substrates which are to be processed in a vacuum chamber can be mechanically and easily controlled by adjusting the position of a susceptor in respect to an electrode body, and the susceptor and other components in the vacuum chamber can be easily cleaned while maintaining a desired evacuated condition and a desired processing performance in the vacuum chamber.

15 Claims, 8 Drawing Sheets

VACUUM PROCESSING APPARATUS

This is a division of application Ser. No. 07/113,117, filed Oct. 27, 1987, now U.S. Pat. No. 4,902,531, issued Feb. 20, 1990.

FIELD OF THE INVENTION

The present invention relates to a vacuum processing method and apparatus and, more specifically, to a method of and an apparatus for processing substrates in vacuum chamber, such as a chemical vapour deposition (CVD).

BACKGROUND OF THE INVENTION

In a conventional vacuum processing apparatus such as a CVD illustrated in FIG. 1 of the accompanying drawings, one or more substrates A are mounted on the surface of a substrate holder B which is disposed in a vacuum chamber C, and is intended to be rotated by a motor D via a rotation transmitting mechanism E. Around the substrate holder B there is provided an earth shield F which is electrically isolated from the substrate holder B by an insulator member G. The substrate holder B is supplied with DC or RF power from a DC or RF power feeder H which may be or a rotating contact type, a capacitor coupling type or the like. Vacuum seal assembly I is provided on the opening of the chamber wall for preventing a rotating shaft and vacuum seal from vibrating during operation of the substrate holder B. The vacuum rotation seal assembly I may comprise O ring seal, Wilson's seal or magnetic fluid seal. The substrate holder B is provided with either or both of a heater or cooling channel into which a power or cooling water is fed by feeding means J such as a rotary joint.

FIG. 2 illustrates an other conventional CVD apparatus in which the same reference characters are used to designate the components corresponding to those in FIG. 1, and a heating mechanism K is separated from the substrate holder B and is secured to the vacuum chamber C.

In the conventional CVD apparatus as shown in FIG. 1 or 2, a plasma is produced in the vacuum chamber by applying suitable RF power to the substrate holder to generate a glow discharge in the vacuum chamber. In order to vary DC bias to be effectively generated at the surface of the substrate (this DC bias to be generated at the surface of the substrate is strictly more or less different from that to be generated at the surface of the substrate holder, but it is assumed herein that the former is the same as the latter), the RF power itself should be controlled, for example, by providing a mechanism (for example, a capacitor, a coil, a resistor or the like) for varying an impedance in the whole substrate holder mechanism in the RF power transmitting circuit. For the DC or RF power feeding mechanism, there should be used means for introducing the power into the rotating mechanism, and thus this leads to difficulty in maintenance or checking. Further, since the capacitor, coil or resistor to be used for varying the impedance have variable characteristics, it is difficult to make a fine adjustment of the DC bias.

Where the conventional apparatus shown in FIG. 1 or 2 is employed for forming a thin film on the substrate or etching the substrate, in the apparatus illustrated in FIG. 1, a film forming material, a reactive gas or the like may be adhered and deposited not only on the surface of the substrate holder, but also on the whole surface of the earth shield and the chamber wall, and in the case of the apparatus illustrated in FIG. 2 such film forming material or reactive gas may be adhered and deposited on the back side of the substrate holder and the surface of the heater assembly. Cleaning of the portions contaminated by such film forming material or reactive gas becomes troublesome.

In the case of the apparatus shown in FIG. 1, even if the cleaning of the contaminated portions is carried out by a plasma which is generated by introducing a suitable reactive gas or inert gas into the vacuum chamber and applying RF or DC power to the substrate holder, the surface of the substrate holder and the portions fully exposed to the plasma may be cleaned, but it is difficult to clean down the portions which are not exposed and not fully exposed to the plasma.

Furthermore, in the apparatus illustrated in FIG. 1, since the substrate holder is rotated together with the earth shield, the weight of the components to be rotated becomes heavy and then it is necessary to use a motor having a larger rotating torque. Complication of the substrate holder and the feeding means for the heater power and the cooling water can not be avoided, and the removal or maintenance of these components become troublesome.

It is, therefore, an object of the present invention to provide a vacuum processing method in which the drawbacks of the above-mentioned conventional system can be overcome and a DC bias to be applied to substrates can be mechanically and easily controlled with excellent reproducibility.

Another object of the present invention is to provide a vacuum processing apparatus in which the drawbacks of the above-mentioned conventional system can be overcome and a DC bias to be applied to substrates can be mechanically and easily controlled with excellent reproducibility.

Still another object of the present invention is to provide a method of cleaning substrate holder or susceptor and other components in a vacuum chamber, in which the susceptor and other components can be easily cleaned with maintaining a required evacuated condition in the vacuum chamber.

Still another object of the present invention is to provide a vacuum processing apparatus in which the susceptor and other components in the vacuum chamber can be easily cleaned with maintaining required evacuated condition and a desired processing performance in the vacuum chamber.

A further object of the present invention is to provide a vacuum processing apparatus which comprises a substrate-electrode mechanism which is functionally excellent and has no above-mentioned drawbacks of the conventional system.

A still further object of the present invention is to provide a CVD apparatus in which the construction can be simplified and an excellent function can be obtained.

SUMMARY OF THE INVENTION

According to a first aspect of the present invention, there is provided a vacuum processing method comprising changing the distance between an electrode member which is electrically insulated from a wall of a vacuum chamber and supplied with an AC voltage for generating a plasma by a glow discharge in said vacuum chamber and a member for supporting at least one substrate to be processed by said plasma, thereby controlling a DC bias to be generated on the surface of said supporting member or the surface of the substrate in respect to said AC voltage.

According to a second aspect of the present invention, there is provided a vacuum processing apparatus comprising an electrode member which is electrically insulated from a wall of a vacuum chamber and is supplied with an AC voltage for generating a plasma by a glow discharge in said vacuum chamber, a drive shaft which is arranged to slidably pass through said chamber wall or said electrode member, a supporting member fixed to the end portion of said driving shaft positioned in said vacuum chamber and intended to support at least one substrate to be processed by said plasma, and a mechanism for driving said drive shaft along the axis thereof, the distance between said electrode member and said supporting member being adjusted so that a DC bias generated on the surface of said supporting member or said substrate is varied in respect to said AC voltage.

The distance between the electrode member and the supporting member may be adjusted by displacing the supporting member in respect to the electrode member.

The AC voltage may be applied only to the electrode member or may be applied to both of the electrode member and supporting member.

When the distance between the electrode member and the supporting member is smaller than a predetermined value, the plasma may be produced in the space on the opposite side of the supporting member to the electrode member or above the supporting member, thereby cleaning the supporting member and the portions positioned in the vicinity thereof. When the distance between the electrode member and the supporting member is larger than said predetermined value, the plasma may be transferred therebetween, thereby cleaning the back side of the supporting member, the electrode member and the portions positioned in the vicinity thereof.

The drive mechanism may comprise means for linearly driving the drive shaft along the axis thereof and means for rotating the driving shaft around the axis thereof.

According to a third aspect of the present invention, there is provided a CVD apparatus comprising an electrode member fixed to a wall of a pressure reduced chamber, a drive shaft adapted to slidably and rotatably pass through the electrode member, a substrate holder mounted on the end portion of the drive shaft positioned in the pressure reduced chamber, a first linear drive means for moving the drive shaft along the axis thereof, a rotary drive means for rotating the drive shaft, a plurality of pins being arranged to be slidably inserted into a plurality of holes provided on the electrode member for lifting each substrate, a second linear drive means for driving the substrate lifting pins along the axes thereof, and a plurality of openings provided on the substrate holder to align with said holes and into which said substrate lifting pins can be inserted.

The rotary drive means may be fixed on a vacuum seal member for sealing in vacuum tight and rotatably supporting the drive shaft, and the first and second linear drive means may be provided on a common base plate which is coupled with the electrode member or the wall of the pressure reduced chamber by guide members. Each of the guide members may be slidably supported on linear bearings.

The drive shaft may be hollow, through which a cooling or heating medium may be circulated via a rotary joint mechanism.

In the CVD apparatus according to the present invention, there may be provided supporting arms each of which has one end mounted perpendicularly on the one end of the associated lifting pin, and the other end of the each supporting arm is extended into a slot formed on the outer peripheral portion of the electrode member and is moved through a slot formed on the outer peripheral portion of the substrate holder and positioned in alignment with the other end of the arm.

The above and other objects and advantages of the invention will become more apparent from the following description and accompany drawings forming part of the present invention.

DETAILED DESCRIPTION OF THE INVENTION

Figure 1:
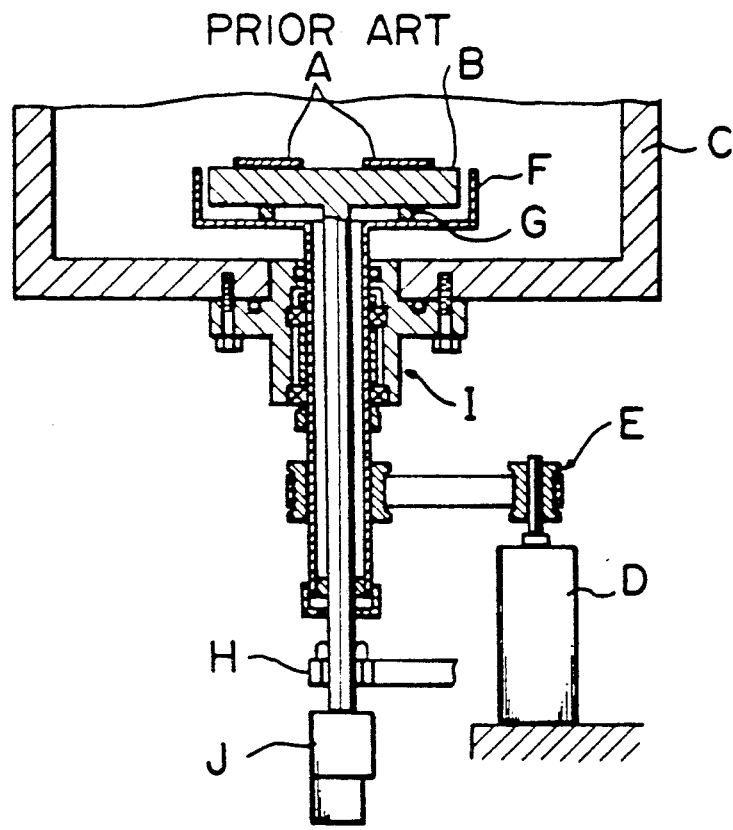
FIGS. 1 and 2 are respectively sectional views showing conventional CVD apparatuses.
Figure 2:
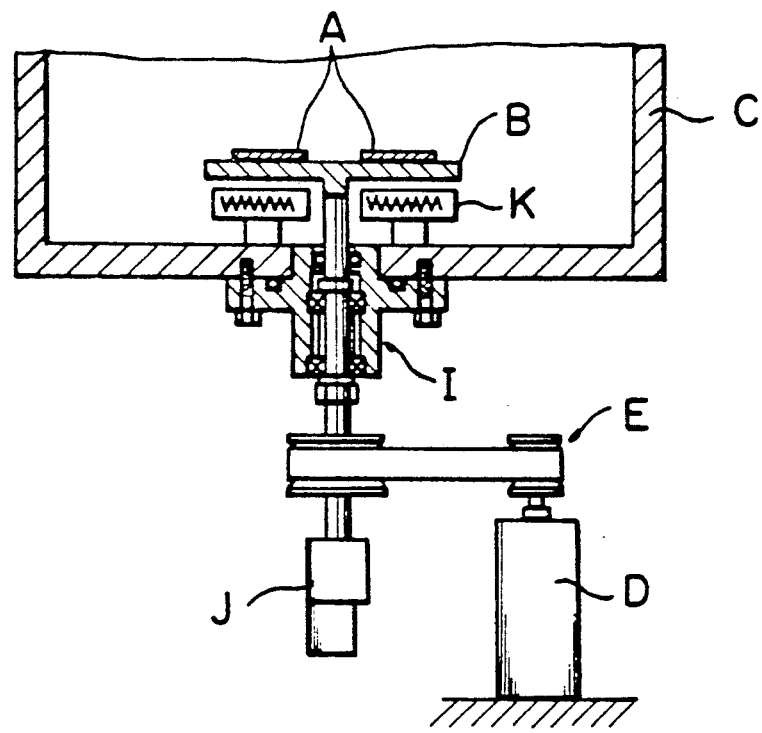
Figure 3:
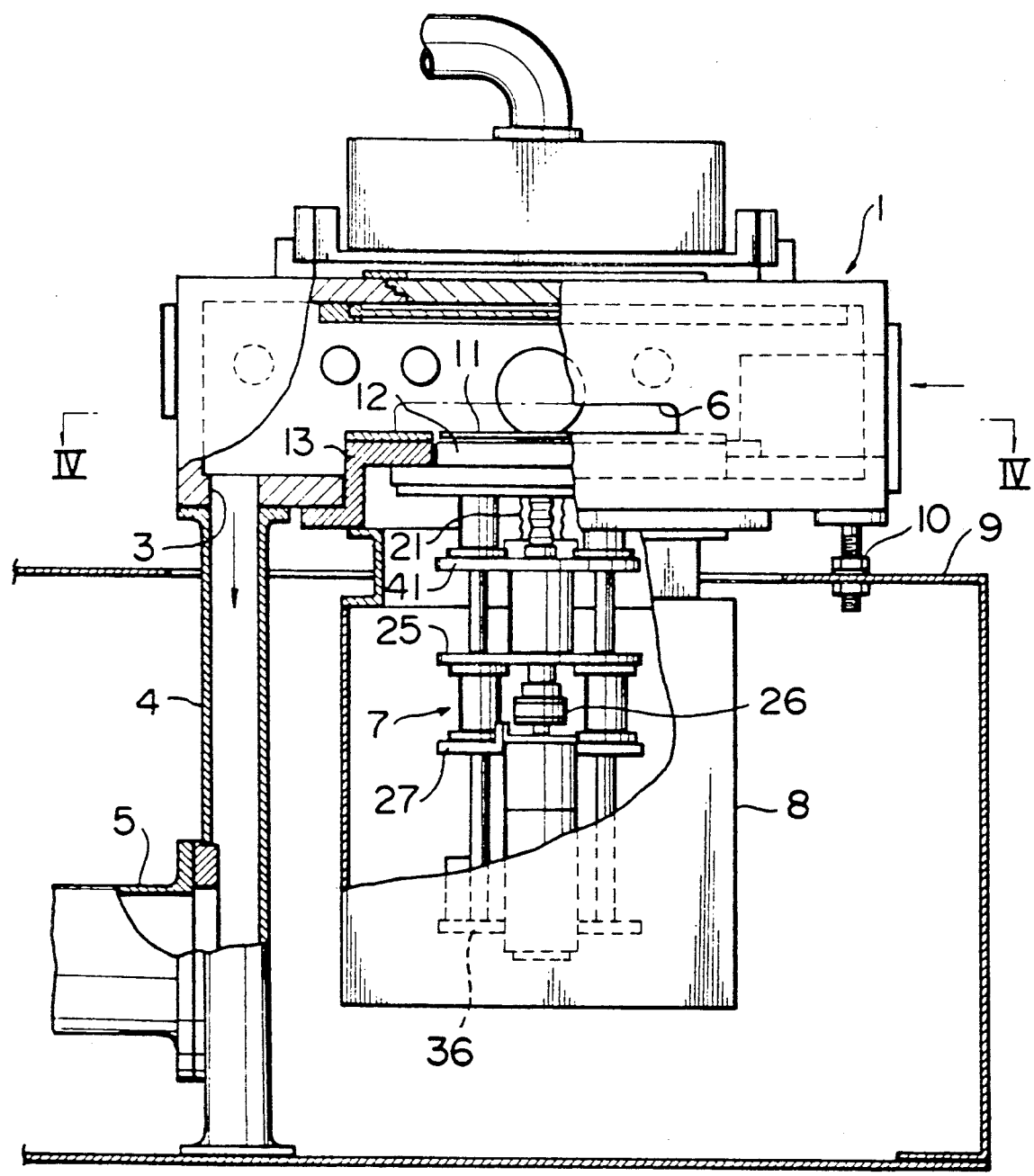
FIG. 3 is an elevation view of the apparatus embodying the present invention with portions thereof broken away to illustrate the internal structure thereof.

Referring now to the drawings and more specifically FIGS. 3 to 9, there is shown a CVD apparatus according to the first embodiment of the present invention. The apparatus comprises a vacuum chamber 1 which has one side wall provided with a reactive gas feeding nozzle 2 and a bottom wall provided with an evacuating port 3. This evacuating port 3 is connected to an evacuating device not shown such as a vaccum pump through an evacuating pipe 4 and a duct 5. The vacuum chamber has also a front wall provided with an opening 6 for loading the substrate to be processed into the vacuum chamber 1 and unloading the processed substrate from the vacuum chamber 1. This opening 6 should be provided with a suitable gate valve which is not shown.

Under the vacuum chamber 1 there is disposed a lifting and rotating mechanism 7 which is enclosed with a casing 8. The lifting and rotating mechanism 7 and the casing 8 are secured to the vacuum chamber 1. The vacuum chamber 1 is fixed on a framework 9 by clamp members only one of which is shown at 10 in FIG. 3.

In the vacuum chamber 1 there is provided a circular susceptor or substrate holder 11 for supporting a substrate to be processed, under which an electrode body 12 is disposed. As used hereinafter regarding the susceptor 11 (substrate holder), the term "rear surface" refers to the surface opposite the substrate supporting surface. The susceptor 11 and the electrode body 12 are surrounded with an annular earth shield 13 which has an inner periphery vacuum tightly secured to the outer flange of the electrode body 12 via an insulating member 14 and seal rings 15 by clamp screws only one of which is shown at 16 in FIG. 5. The outer periphery or flange of the earth shield 13 is vacuum tightly secured to the bottom wall 1a of the vacuum chamber 1 by clamp screws only one of which is shown at 17 in FIG. 5. To the top surface of the earth shield 13 there is attached an annular member 18 which may be made of a quartz.

The susceptor 11 has a central portion intergratedly fixed to a rotating shaft 9 which extends through the central bore 12a of the electrode body 12 and is tightly and rotatably supported by a vacuum rotating seal assembly 20 having bellows 21 and a pair of bearings 22 and 23. The bearings 22 and 23 are mounted on a casing 24 which has a lower end secured to an intermediate mounting plate 25.

Figure 7:
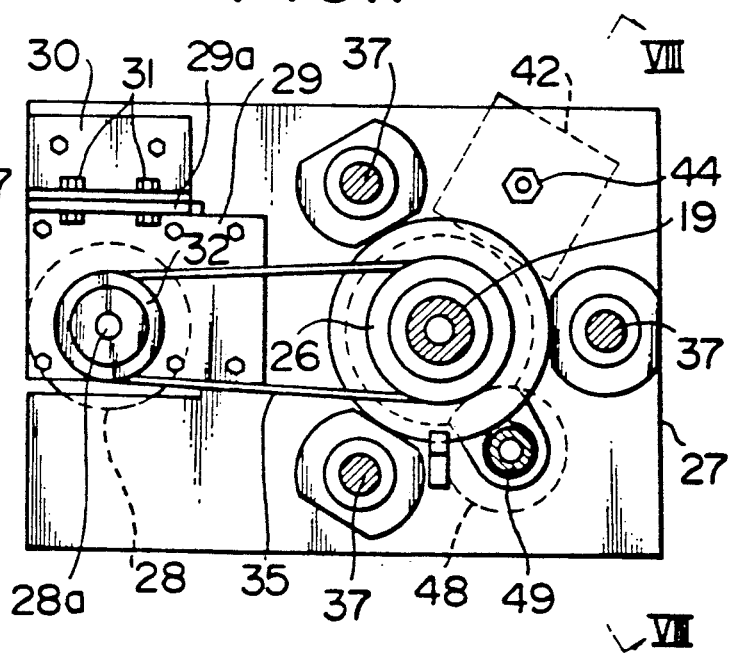
FIG. 7 is a cross-sectional view of FIG. 5 taken along the line VII—VII thereof.
Figure 5:
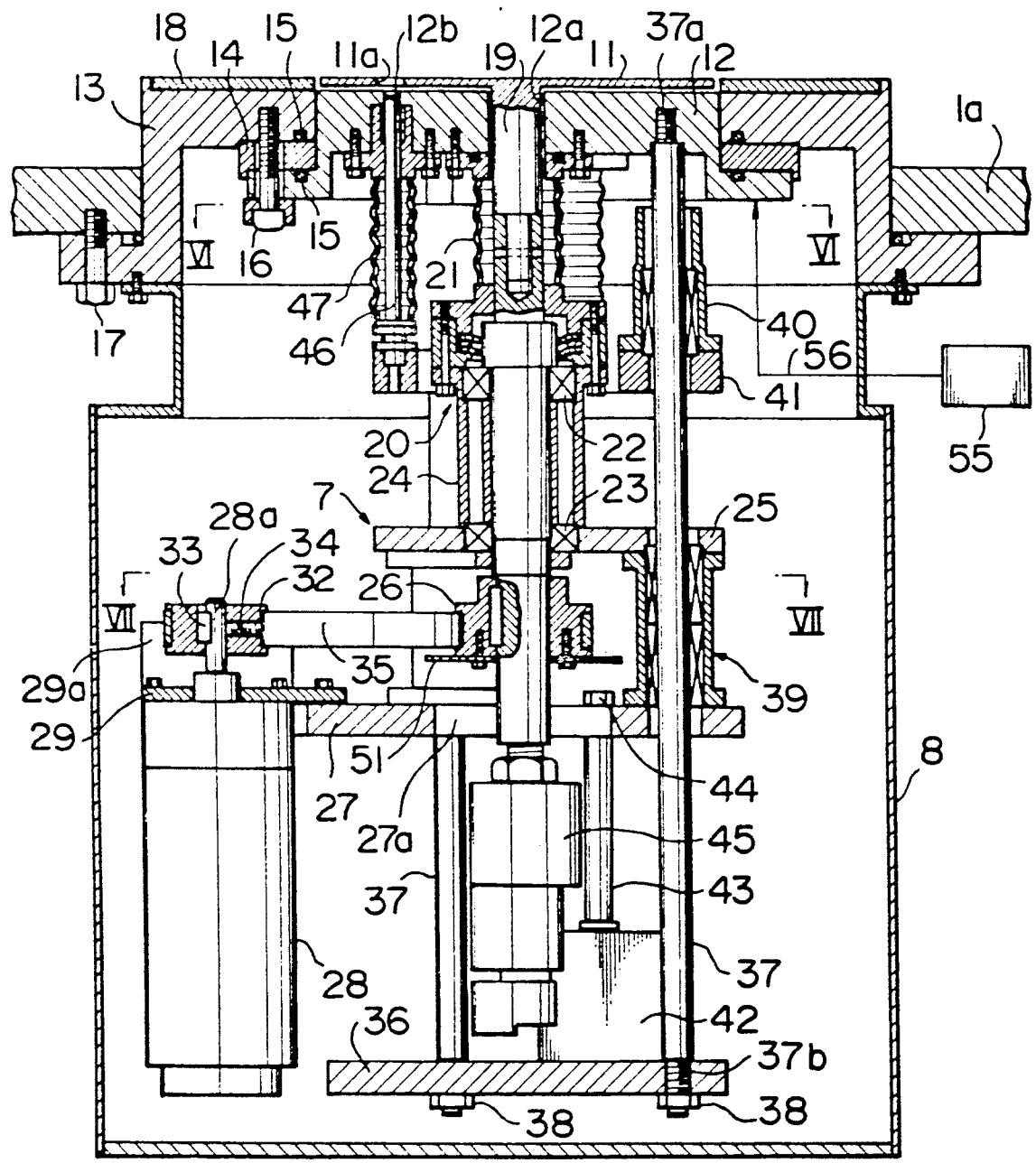
FIG. 5 a longitudinal sectional view of FIG. 4 taken along the line V—V thereof.

The rotating shaft 19 is provided with a pulley 26 near the lower end portion thereof. Under the intermediate mounting plate 25 there is disposed a lower mounting plate 27 to which a motor 28 is secured by a retainer member 29. As shown in FIGS. 5 and 7, the retainer member 29 has an upstanding portion 29a to which L-shaped member 30 is secured by screws 31. The L-shaped member 30 is also secured to the lower mounting plate 27. The motor 28 is provided with a output rotating shaft 28a on which a pulley 32 is fixed by a key 33 and a clamp screw 34. A timing belt 35 is engaged with both of the pulley 32 and the pulley 26.

Figure 6:
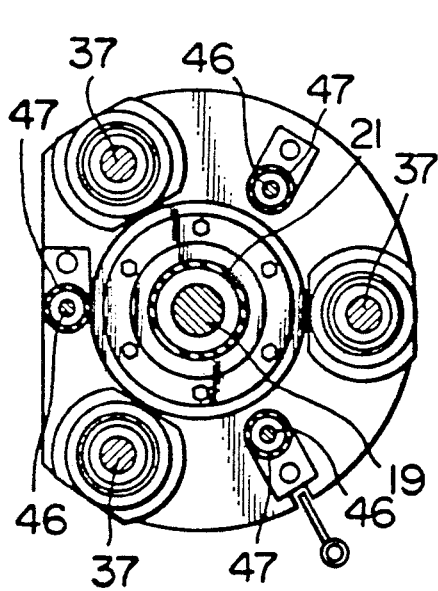
FIG. 6 is a cross-sectional view of FIG. 5 taken along the line VI—VI thereof.

Under the lower mounting plate 27 there is disposed a base plate 36 which as shown in FIGS. 5, 6 and 7 is secured to the electrode body 12 by three guide rods 37 being positioned at an equal angular position. Each of the guide rods 37 has an upper end 37a screwed on the electrode body 12 and a lower screwed end 37b fixed to the base plate 36 by a nut 38. Each of the guide rods 37 is slidably supported by a lower linear ball bearing 39 mounted between the intermediate mounting plate 25 and the lower mounting plate 27, and an upper linear ball bearing 40 mounted on an upper mounting plate 41. Therefore, the upper, intermediate and lower mounting plates 41, 25 and 27 can be exactly moved upwards and downwards by the guide rods 37.

An air cylinder device 42 is provided on the base plate 36. This air cylinder device 42 comprises a drive rod 43 which is secured to the lower mounting plate 27 by a nut 44.

The lower end portion of the rotating shaft 19 is passed through the opening 27a of the lower mounting plate 27 and is connected to a cooling water feeding device 45 which is a rotary joint or union and from which cooling water is fed through a feed channel of the rotating shaft 19 and flows out of the rotating shaft 19 through a return channel thereof. The electrode body 12 is provided with a separated cooling water supply which is not shown.

On the upper mounting plate 41 there are provided three substrate lifting pins 46. Each pin 46 has a lower end portion secured to the upper mounting plate 41 and an upper end portion extended through the associated one of bores 12b which are formed on the periphery of the electrode body 12. Between the electrode body 12 and the upper mounting plate 41 bellows 47 surround the pins 46 to shut off these pins from the atmosphere.

Figure 8:
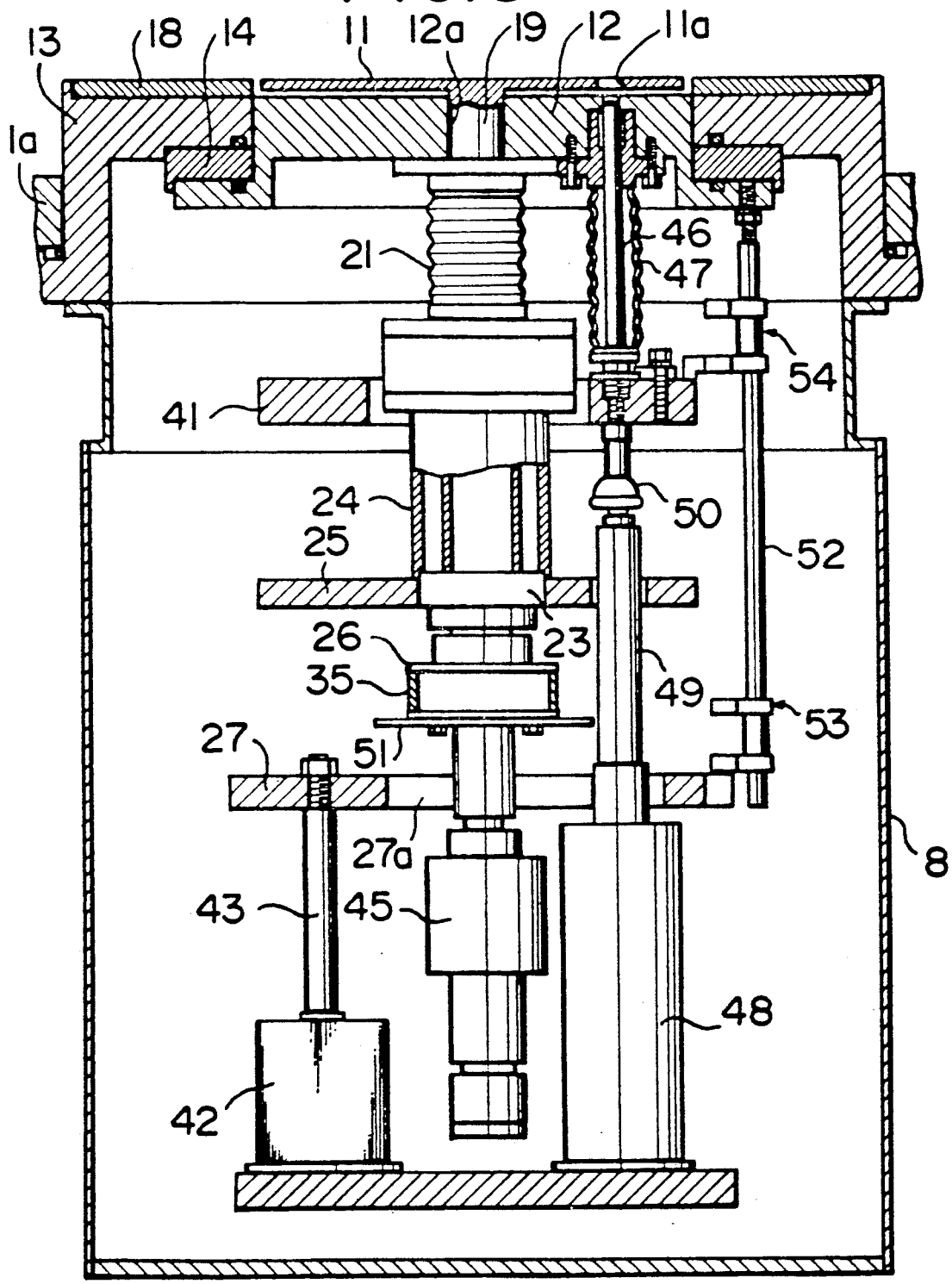
FIG. 8 is a longitudinal sectional view of FIG. 7 taken along the line VIII—VIII thereof.
Figure 9:
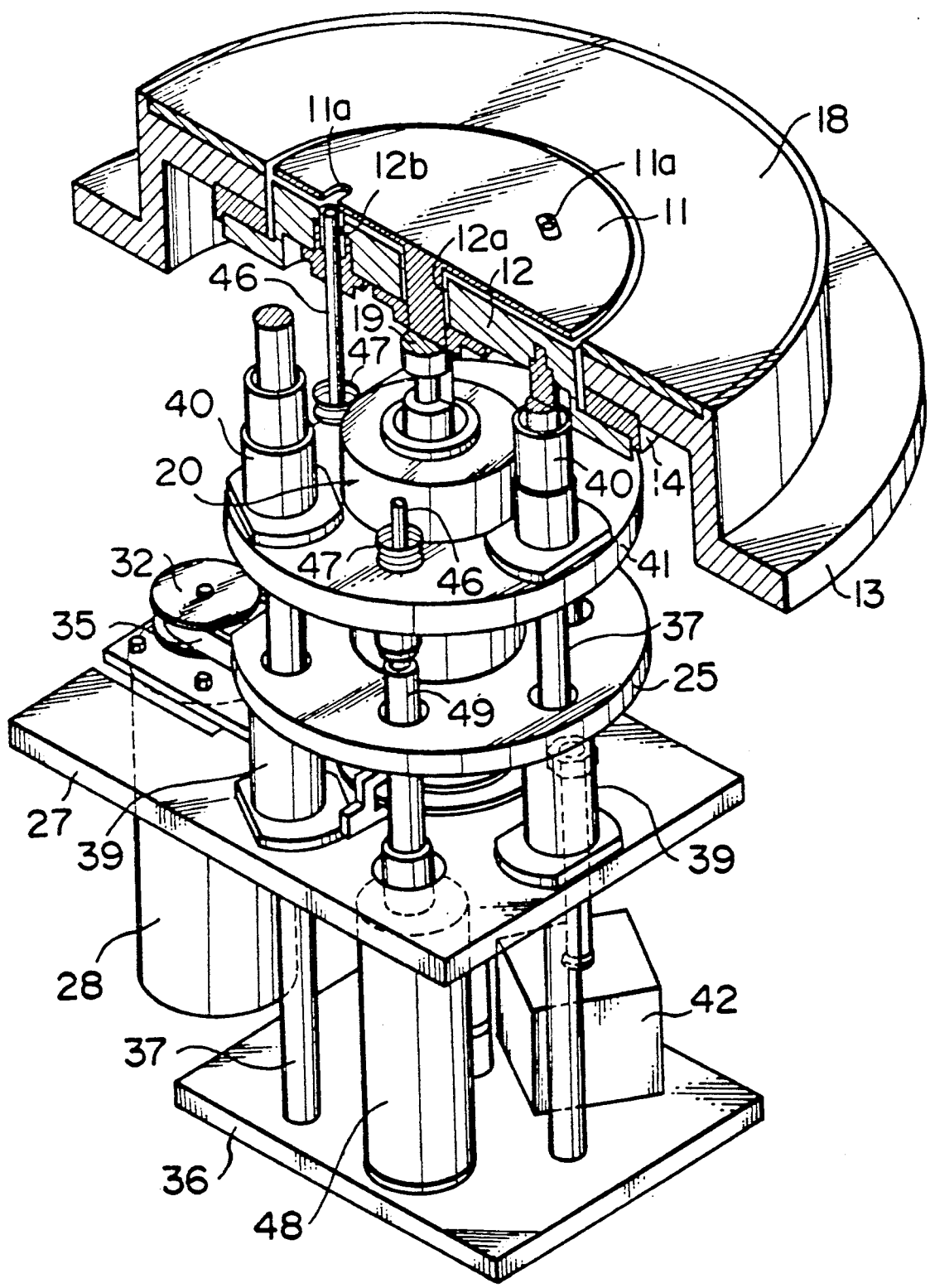
FIG. 9 is a perspective view of the essential portions of the CVD apparatus according to the present invention.

As shown in FIGS. 8 and 9, a substrate lifting pin driving device 48 is provided on the base plate 36. This substrate lifter driving device 48 includes a driving rod 49 the upper end of which is coupled with the upper mounting plate 41 via a link member 50.

Figure 4:
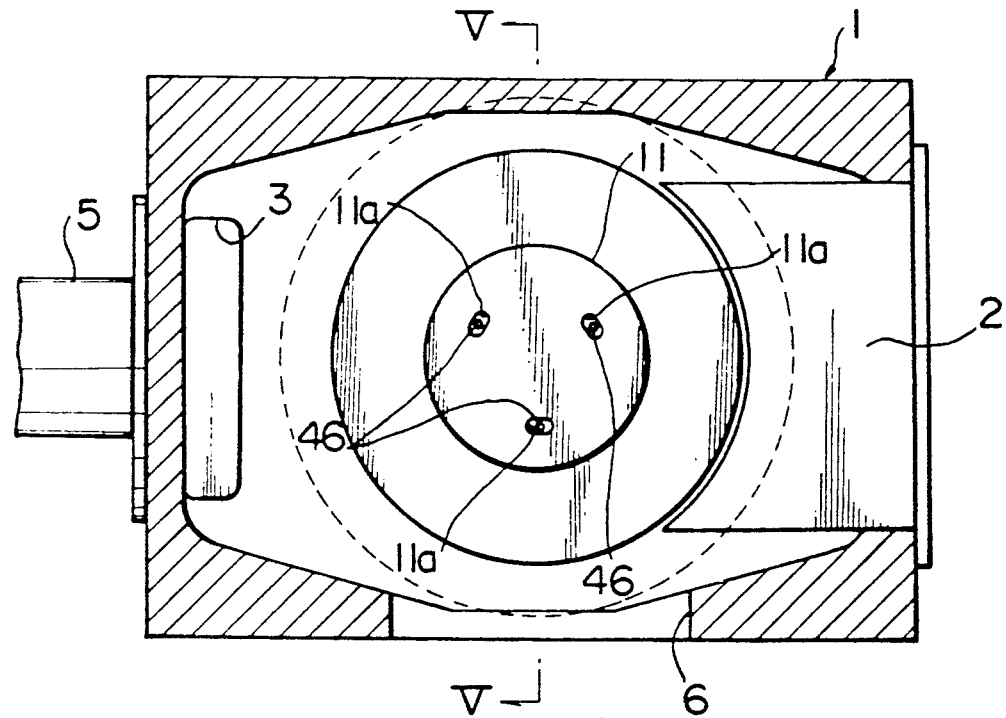
FIG. 4 is a cross-sectional view of FIG. 3 taken along the line IV—IV thereof.

The susceptor 11 is provided with three slots 11a which are positioned at 120° intervals about the center thereof to receive the substrate lifting pins 46. The susceptor 11 may be rotated by means of the motor 28 so that the slots 11a are aligned with the respective substrate lifting pins 46 as shown in FIG. 4. The angular positioning of the susceptor 11 against the respective lifting pins 46 may be controlled by a position sensor 51 which is attached to the pulley 26.

The substrate, not shown, placed on the susceptor 11 may be lifted by moving the respective lifting pins 46 upwards through the slots 11a of the susceptor 11 by means of the upper mounting plate 41 which is driven by the driving device 48.

As shown in FIG. 8, from the electrode body 12 is suspended a sensor supporting rod 52 which supports a sensor 53 for detecting the lifted position of the lower mounting plate 27 and therefore the susceptor 11, and a sensor 54 for detecting the lifted position of the upper mounting plate 41 and therefore the lifting pins 46.

The electrode body 12 is supplied with RF power from RF power supply 55 through a circuit 56 as shown in FIG. 5.

The operation of the illustrated apparatus will now be described.

The substrate to be processed is positioned on the susceptor 11 in the vacuum chamber 1, the vacuum chamber 1 is evacuated so that it has a predetermined pressure, and a suitable gas is introduced into the vacuum chamber 1 for generating the plasma by a glow discharge.

When the cylinder device 42 is operated, the drive rod 43 is moved upwards, and then the lower mounting plate 27, the intermediate mounting plate 25 and the rotating shaft 19 are lifted. Therefore, the susceptor 11 is raised so that the distance d between the susceptor 11 and the electrode body 12 is increased.

Figure 10A:
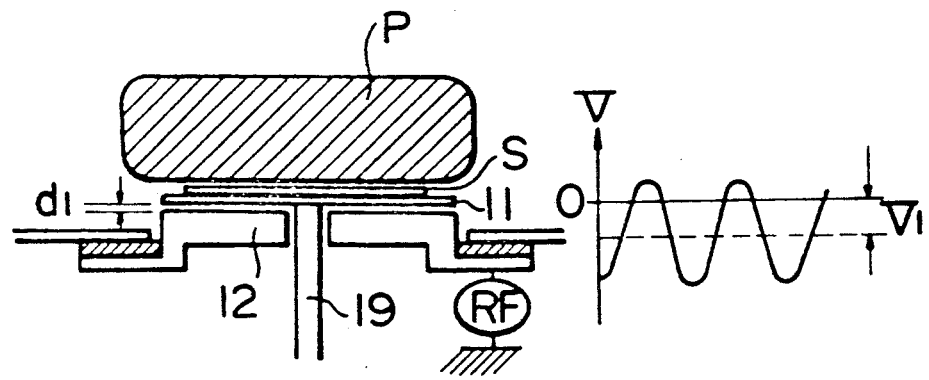
FIG. 10 is a schematic view to explain the operation of the illustrated embodiment.
Figure 10B:
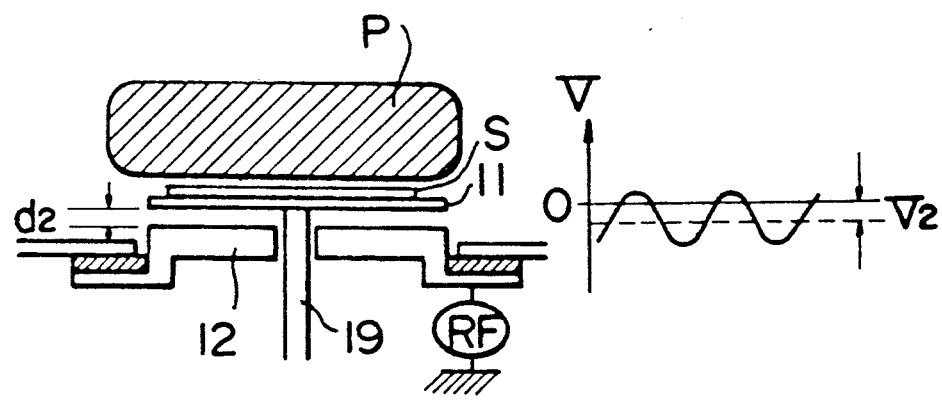
Figure 10C:
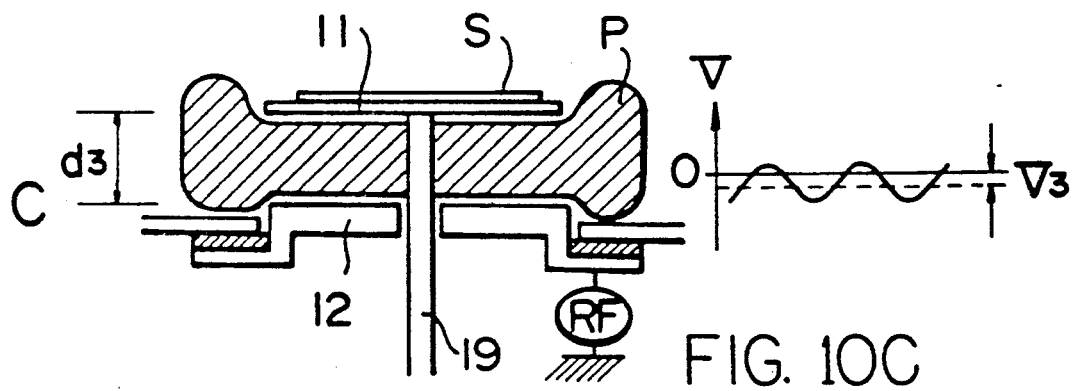

FIG. 10 shows the relation of the distance d to the potential V which is generated on the surface of the susceptor 11 or substrate S.

As shown in FIG. 10-A, when the distance d is a small, that is d1, DC bias voltage becomes large value V1, and the plasma P is generated on the substrate S.

When the distance d is increased as shown at d2 in FIG. 10-B, DC bias voltage is decreased to the value V2. In this case, the plasma to be generated is maintained above the substrate S. When the distance d is more increased as shown at d3 in FIG. 10-C, DC bias voltage is decreased to the value V3 which is lower than V2, and the plasma is transferred into the space defined between the susceptor 11 and the electrode body 12. It is, therefore, appreciated that the potential on the susceptor 11 and DC bias voltage can be varied and the area where the plasma is to be produced can be changed in response to the position of the susceptor 11.

In sputtering, etching, Plasma CVD or the like, generally, RF bias is applied to the substrates to be processed and a suitable DC bias voltage is applied to the substrates in order to improve the property of a thin film to be formed on the substrate, step coverage, anisotropy of an etching or the like. For this end, in the coventional system, an electrical control has been utilized.

In accordance with the illustrated embodiment of the present invention, however, DC bias voltage can be easily changed by adjusting the position of the susceptor 11 in respect to the electrode body 12.

In the illustrated embodiment, therefore, the position of the susceptor 11 can be adjusted in view of the property of the thin film to be formed on the surface of the substrate on the susceptor 11 and the other characteristics. The intermediate mounting plate 25 and the lower mounting plate 27 are guided and lifted along the guide rod 37. Thus, the rotating shaft 19 may be exactly raised without shakying. When the rotating shaft 19 is moved to a predetermined raised position, the sensor 53 attached to the supporting rod 52 feeds the output signal to the air cylinder device 42, and therefore the air cylinder device 42 is deenergized, thereby stopping the susceptor 11 at the desired distance from the electrode body 12.

Then, the motor 28 is energized so that the rotating shaft 19 is rotated through the timing belt 35 and the pulley 26, and the susceptor 11 is rotated. From the reactive gas feeding nozzle 2 a reactive gas is introduced into the vacuum chamber 1. On the surface of the substrate positioned on the susceptor 11 there can be uniformly formed a thin film which includes, the components of the reactive gas.

When the thin film having a predetermined thickness is formed on the surface of the substrate, the feeding of the reactive gas into the vacuum chamber 1 is stopped and the motor 28 is deenergized so that the susceptor 11 is stopped. And then the air cylinder device 42 is energized so that the drive rod 43 is moved downwards to down the susceptor 11 to the position as shown in FIG. 5. When the susceptor 11 reaches that position, the sensor 53 applies the output signal to the air cylinder device 42 to stop it. When the motor 28 is deenergized, the susceptor 11 is stopped so that the slots 11a are aligned with the respective lifting pins 46 by means of the position sensor 51.

With the energizing of the substrate lifter driving device 48, the upper mounting plate 41 is moved upwards, and then the lifting pins 46 are passed through the respective slots 11a in the susceptor 11 to push the substrate upwards. A suitable carrier fork not shown is inserted into the vacuum chamber 1 through the opening 6 so as to receive the substrate raised by the lifting pins 46, and the substrate is carried out of the vacuum chamber by this fork.

Next substrate to be processed is placed on the carrier fork, is introduced into the vacuum chamber 1, through the opening 6 and is positioned on the raised lifting pins 46.

Thereafter, with the energizing of the cylinder device 48, the lifting pins 46 is fallen to the position as shown in FIG. 5 so that the substrate is mounted on the susceptor 11. In this case, the downward movement of the lifting pins 46 can be detected by the sensor 54 which feeds a control signal to the cylinder device 48 to stop the operation thereof. In this way, the operation of the system may be sequentially repeated for processing successive substrates.

In the cleaning operation of the illustrated apparatus, the susceptor 11 has no substrate mounted thereon. In order to clean the surface of the susceptor 11 and the portions in the vicinity thereof, for example, chamber wall, the susceptor is set to the position as shown in FIG. 10-A or 10-B. Therefore, these portions may be cleaned by the bombardment of the plasma which is produced in the space above the susceptor. In this case, since the produced plasma penetrates little into the area between the susceptor 11 and the electrode body 12, the rear portion of the susceptor 11 and the surface of the electrode 12 can not substantially be cleaned. The rear surface of the susceptor 11 and the surface of the electrode body 12 can be cleaned by raising, the susceptor 11 with the operation of the air cylinder device 42 and forming the plasma between the susceptor 11 and the electrode body 12 as shown in FIG. 10-C.

Figure 11:
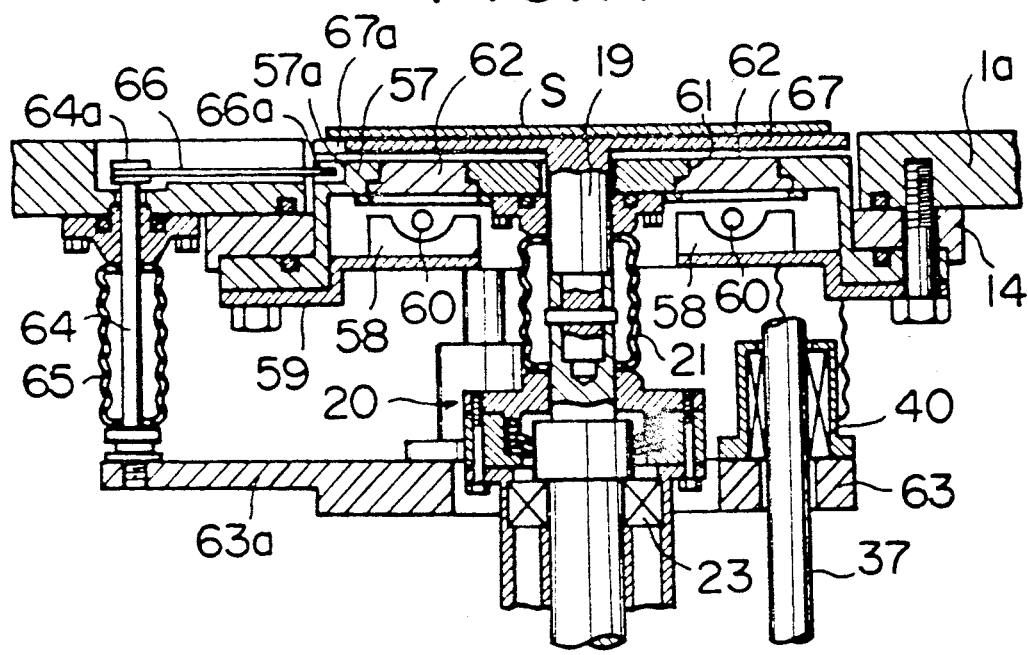
FIG. 11 is a longitudinal sectional view of showing a modified embodiment of the present invention.
Figure 12:
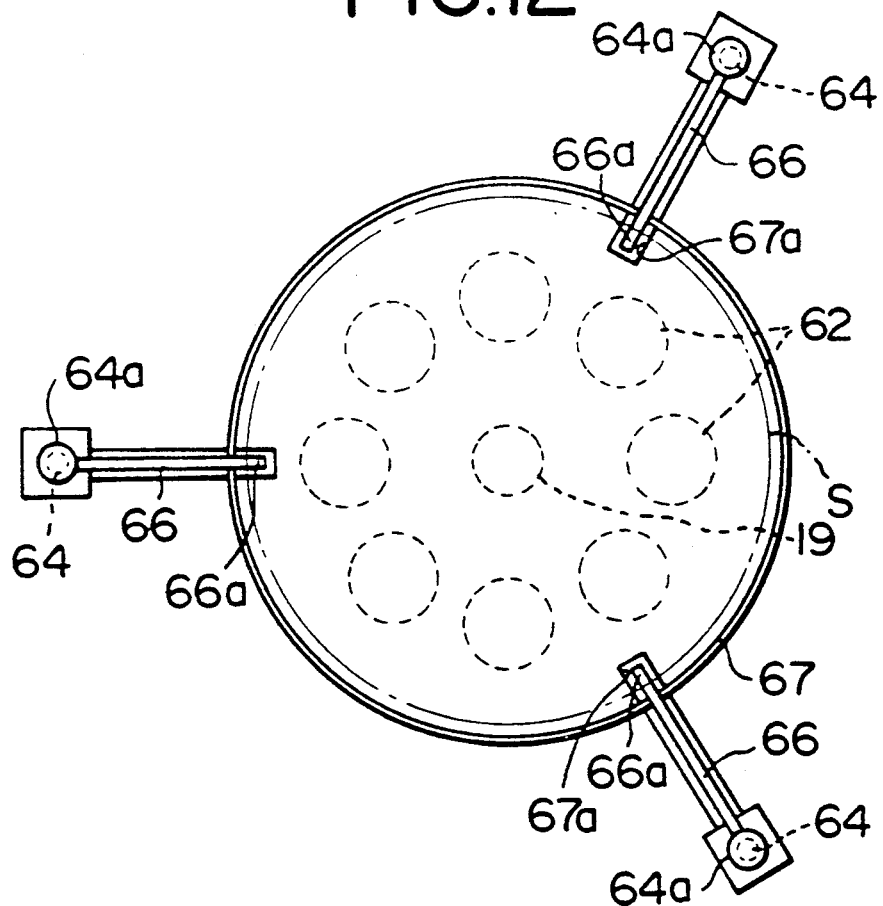
FIG. 12 is a plane view of the apparatus of FIG. 11.

A modified embodiment of the invention is illustrated in FIGS. 11 and 12 in which the same numerals are used to denote the elements corresponding to those in FIGS. 3 to 9.

On the atmospheric side of an electrode body 57 heater assemblies 58 are attached by a mounting member 59. The heater assemblies 58 are arranged at equal angular intervals. Each of the heater assemblies 58 comprises an infrared lamp 60. The electrode body 57 is provided with a plurality of openings 61 which are opposite to the respective heater assemblies 58. In each opening 61 of the electrode body 57 there is tightly fitted a window member 62 which may be made of a transparent material having a low infrared absorption, for example quartz. A linear bearing 40 is secured to a mounting plate 63 which is provided with equally spaced three extensions, only one of the extensions being shown at 63a in FIG. 11. On each extension 63a there is provided a substrate lifting pin 64 which is surrounded with bellows 65, and has a top end 64a tightly and slidably passed through the bottom wall 1a of a vacuum chamber and positioned in the vacuum chamber. To the top end 64a of the pin 64 is attached one end of a horizontal arm 66, the other end, 66a of the horizontal arm 66 being extended into the associated one of recesses 57a which are provided on the periphery of the electrode body 57. Susceptor 67 fixed on the driving shaft 19 is provided with recesses 67a at the periphery thereof. The recesses 67a of the susceptor 67 are positioned at the same angular intervals as that of the recesses 57a of the electrode body 57 so that the recesses 67a may be aligned with the recesses 57a as shown in FIG. 12. The susceptor 67 may be angularly positioned in respect to the electrode body 57 by means of a position sensor as in the first embodiment. It should be understood that the substrate S has an outer periphery positioned over the ends 66a of the horizontal arms 66. It should be also understood that the other arrangement is substantially similar to the first embodient.

In the operation of the apparatus illustrated in FIGS. 11 and 12, A thin film can be uniformly formed on the surface of the substrate S while it is rotated. Upon the forming of the thin film, the substrate S is heated by the infrared ray from the heater assemblies 58. In this connection, if the susceptor 67 is made of transparent material, the substrate S may be directly heated by the infrared beam, but if does not so, the substrate S may be heated with the heat transfer.

When the thin film having, a desired thickness is formed on the surface of the substrate S, the rotation of the susceptor 67 is stopped so that the recesses 67a thereof may be aligned with the recesses 57a of the electrode body 57 by the position sensor as in the first embodiment, and then the susceptor 67 is moved to the position shown in FIG. 11 by raising or lowering the drive shaft 19.

Thereafter, the mounting plate 63 is lifted to move the lifting pins 64 and therefore the horizontal arms 66 upwards. Thus, the substrate S is raised to the loading or unloading position by the arms 66 being moved upwards.

It should be appreciated that in this modified embodiment the cleaning operation and the controlling of DC bias may be performed in the same manner as that of the first embodiment.

Further, it should be understood that in this embodiment, the electrode body 57, the heater assemblies 58 and the portions which are to be cooled may be cooled by suitable cooling means.

According to the present invention as described above, the DC bias to be produced on the surface of the substrate can be mechanically controlled, and the susceptor and the other components in the vacuum chamber can be easily cleaned while maintaining the desired evacuated condition in the vacuum chamber.

The present invention has also advantages of reducing the load of the rotary drive mechanism, and assembling and disassembling easily the rotary drive mechanism.

While the present invention has been described in detail with respect to certain now preferred embodiments, it will be understood that various changes and modifications may be made within the scope of the claimed invention. For example, the present invention may be equally applied to sputtering, plasma etching, plasma CVD or other surface processing apparatus.

What is claimed is:

1. A vacuum processing apparatus comprising:
   an electrode member which is electrically insulated from a wall of a vacuum chamber and is supplied with an AC voltage for generating a plasma by a glow discharge in said vacuum chamber;
   a substrate holder, disposed above said electrode, for supporting at least one substrate to be processed by said plasma, said substrate holder having a rear surface and said substrate holder being disposed such that said rear surface thereof is located opposite and faces said electrode member;
   a shaft for supporting said substrate holder so that the substrate holder is relatively displaceable with respect to the electrode member; and
   means connected to said shaft for varying the distance between said electrode member and said substrate holder so as to control a DC bias to be generated on the surface of said substrate holder or the surface of said substrate with respect to said applied AC voltage and to thereby control generation of a plasma on the surface of the electrode member or the rear surface of the substrate holder so as to provide cleaning thereof.

2. An apparatus according to claim 1, wherein said means comprises means for providing linear movement of the shaft along the axis thereof and means for rotating the shaft around the axis thereof.

3. A CVD apparatus comprising an electrode member fixed to a wall of a pressure reduced chamber, a drive shaft extending slidably and rotatably through said electrode member, a substrate holder mounted on an end portion of said drive shaft positioned in said pressure reduced chamber, a first linear drive means for moving said drive shaft along the axis thereof, a rotary drive means for rotating said drive shaft, a plurality of pins arranged to be slidably inserted into a plurality of holes provided on said electrode member for lifting each substrate, a second linear drive means for driving the substrate lifting pins along the axes thereof, and a plurality of openings provided in said substrate holder for alignment with said holes and for receiving said substrate lifting pins.

4. A CVD apparatus according to claim 3, wherein said rotary drive means is fixed on a vacuum seal member for sealing in a vacuum tight manner and rotatably supporting said drive shaft.

5. A CVD apparatus according to claim 3, wherein said first and second linear drive means are provided on a common base plate which is coupled to said electrode member or the wall of said pressure reduced chamber by guide members.

6. A CVD apparatus according to claim 5, wherein said each guide member is slidably supported on linear bearings.

7. A CVD apparatus according to claim 5, wherein said drive shaft is hollow, and said apparatus further includes a rotary joint for circulating a temperature control medium through said drive shaft.

8. A CVD apparatus according to claim 5 further comprising supporting arms one end of each of which is mounted perpendicularly on one end of the associated lifting pin, the other end of the each supporting arm extending into a slot formed in the outer peripheral portion of said electrode member and being moved through the associated one of slots formed on the outer peripheral portion of said substrate holder and positioned in alignment with the other end of said supporting arms.

9. A vacuum processing apparatus comprising:
   a vacuum chamber;
   an electrode member mounted within said vacuum chamber and electrically insulated from a wall of said vacuum chamber;
   means for supplying AC voltage to said electrode member so as to generate a plasma by a glow discharge in said vacuum chamber;
   a substrate holder for supporting at least one substrate to be processed by said plasma and disposed within said vacuum chamber above said electrode member so that, in operation, a DC bias for said AC voltage is generated on the surface of said substrate holder or on the surface of said substrate, said substrate holder having a rear surface and said substrate holder being disposed such that said rear surface thereof is located opposite and faces said electrode member;
   a shaft for supporting said substrate holder so that the substrate holder is relatively displaceable with respect to the electrode member; and
   means connected to said shaft for varying the distance between said electrode member and said substrate holder so as to control the DC bias to be generated on the surface of said substrate holder or the surface of said substrate and to thereby control generation of a plasma on the surface of the electrode member or on the rear surface of the substrate holder so as to provide cleaning thereof.

10. An apparatus according to claim 9, wherein said means comprises means for providing linear movement of the shaft along the axis thereof and means for rotating the shaft around the axis thereof.

11. An apparatus according to claim 9, wherein said means for supplying said AC voltage comprises means for supplying said voltage only to said electrode member.

12. An apparatus according to claim 9, wherein said means for supplying said AC voltage comprises a single AC voltage source connected to said electrode member and said substrate holder.

13. An apparatus according to claim 9, wherein said means for varying the distance between said electrode member and said substrate holder comprises means for setting the distance between said electrode member and said substrate holder to be smaller than a predetermined value so that the surface of said substrate holder and the portions in the vicinity thereof are cleaned by bombardment of the plasma produced on the surface of said substrate holder or of the substrate.

14. An apparatus according to claim 9, wherein said means for varying the distance between said electrode member and said substrate holder comprises means for setting the distance said electrode member and said substrate holder so as to be larger than a predetermined value so that the rear portion of said substrate holder, said electrode member and the portions located in the vicinity thereof are cleaned by bombardment of the plasma produced in the space between said substrate holder and said electrode member.

15. An apparatus according to claim 9, wherein said shaft is hollow and said apparatus further comprises a rotary joint for circulating a temperature control medium through said shaft.

* * * * *